United States Patent [19]
Liu

[11] Patent Number: 5,923,998
[45] Date of Patent: *Jul. 13, 1999

[54] ENLARGED ALIGN TOLERANCE IN BURIED CONTACT PROCESS USING SIDEWALL SPACER

[75] Inventor: Ming-Hsi Liu, Chung-Li, Taiwan

[73] Assignee: Winbond Electronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/625,873

[22] Filed: Apr. 1, 1996

[51] Int. Cl.$^6$ .................................................. H01L 21/425
[52] U.S. Cl. .......................... 438/526; 438/586; 438/595; 438/948; 438/301
[58] Field of Search .................................. 438/526, 586, 438/595, 948, 301

[56] References Cited

U.S. PATENT DOCUMENTS

| | | | |
|---|---|---|---|
| 5,126,285 | 6/1992 | Kosa et al. | 437/191 |
| 5,145,797 | 9/1992 | Nakanishi | 437/43 |
| 5,162,259 | 11/1992 | Kolar et al. | 437/192 |
| 5,326,713 | 7/1994 | Lee | 437/41 |
| 5,538,913 | 7/1996 | Hong | 438/586 |
| 5,576,242 | 11/1996 | Liu | 438/586 |
| 5,654,231 | 8/1997 | Liang et al. | 438/586 |

OTHER PUBLICATIONS

Silicon Processing for the VLSI Era, pp. 295–308.
Calvin T. Gabriel and James P. McVittie, How Plasma Etching Damages Thin Gate Oxides, Abstract, Jun. 1992, Solid State Tech., pp. 81–87.
Stanley Wolf, "Silicon Process for the VLSI Era", Lattice Press, Sunset Beach, California, 1986 pp. 295–308.

Primary Examiner—John F. Niebling
Assistant Examiner—David A. Zarneke
Attorney, Agent, or Firm—Proskauer Rose LLP

[57] ABSTRACT

A method of manufacturing a buried contact is disclosed, wherein a thin silicon oxide layer is formed on the silicon substrate. The thin oxide functions as a gate dielectric. Subsequently, a thin first polysilicon layer is formed on the thin silicon oxide layer. Then, a buried contact opening is defined by a first photoresist mask. The portion of the thin polysilicon layer exposed through the first photoresist mask and the thin silicon oxide layer underneath the exposed thin polysilicon are anisotropically etched to form a buried contact hole. An ion implantation is performed into the substrate throughout the buried contact hole to form an N+region. The first photoresist mask is removed and a layer of undoped silicon oxide is deposited on the entire surface. An anisotropic etching is used to etch the undoped silicon oxide. The etching depth can be controlled by this process. Residual amounts of undoped silicon oxide are retained on the vertical edges of the buried contact hole to act as spacers. A second layer of polysilicon is then deposited on the entire surface. A second photoresist mask is formed to define a pattern in the second polysilicon layer. Portions of the second polysilicon layer exposed through the second photoresist mask are etched using an anisotropic etching process. The high etching selectivity obtainable between the polysilicon layer and silicon oxide spacers avoids damage to the substrate in the case of a left misalignment. The alignment tolerance of the second photoresist mask is determined by the width of the silicon oxide spacer. A second implantation is then performed to form a source/drain N+region which is in contact with the previously formed N+region. Discontinuity of the two N+regions due to misalignment in the second masking step is avoided.

5 Claims, 13 Drawing Sheets

ENLARGED ALIGN TOLERANCE IN BURIED CONTACT PROCESS USING SIDEWALL SPACER

FIELD OF THE INVENTION

The present invention relates to a buried contact process. In particular, the present invention relates to a process for forming a buried contact with a large alignment tolerance.

BACKGROUND OF THE INVENTION

During the conventional buried contact process, misalignment of a polysilicon pattern can either damage the silicon substrate or cause discontinuity between a buried contact N+region and a source/drain N+region. To illustrate these problems, a representative example of the prior art technology for a buried contact process is shown in FIG. 1A through FIG. 3C.

Figure 1A:
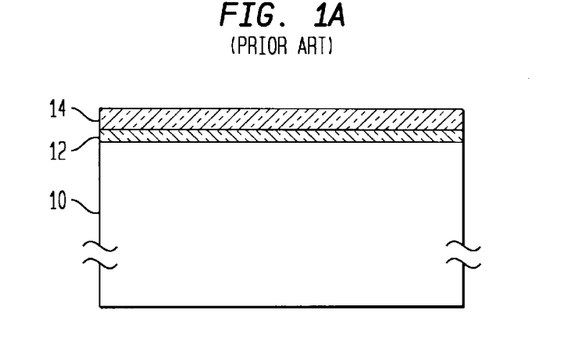

In FIG. 1A, a silicon substrate 10 is covered by a thin silicon oxide layer 12 which functions as gate dielectric. A thin layer of polysilicon 14 is deposited on the thin silicon oxide layer 12.

Figure 1B:
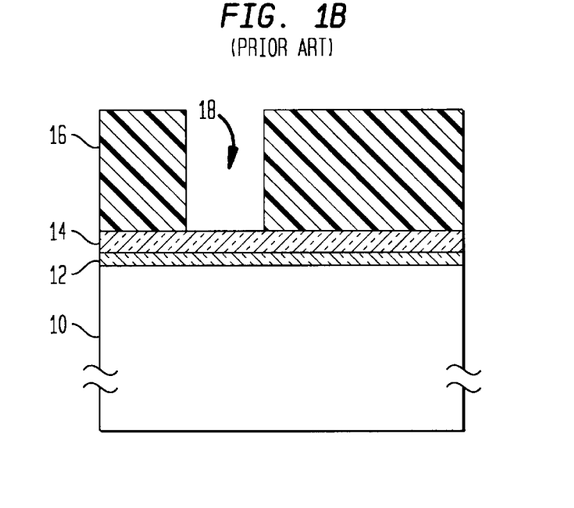

In FIG. 1B, a photoresist mask 16 is formed on the thin polysilicon layer 14 to define the buried contact pattern.

Figure 1C:
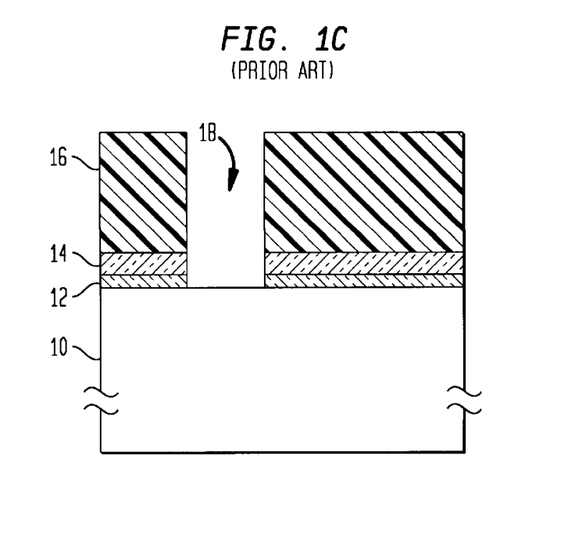

In FIG. 1C, the exposed portion of the thin polysilicon layer 14 and the portion of the thin silicon oxide layer 12 that is underneath the exposed portion of the thin polysilicon layer 14 are anisotropically etched. The buried contact hole 18 is thereby, formed.

Figure 1D:
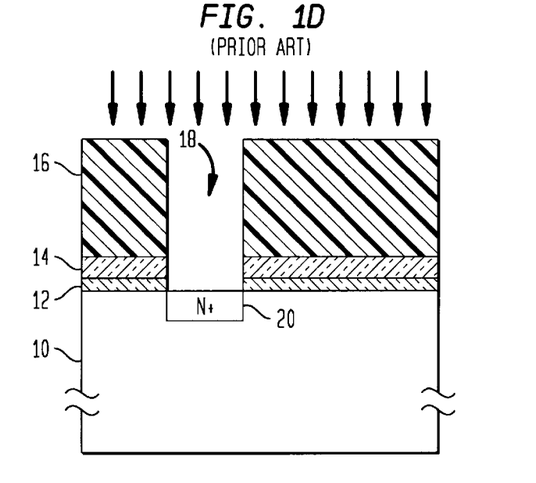

In FIG. 1D, an ion implantation is performed through the buried contact hole 18 to form a buried contact N+region 20.

Figure 1E:
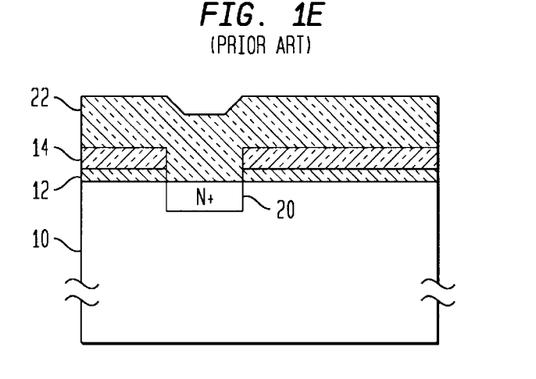

In FIG. 1E, the photoresist mask 16 is removed and a layer of polysilicon 22 is deposited on the surface. The polysilicon layer 22 is heavily doped with an N-type dopant such as phosphorous to create a low electrical resistance film.

Figure 1F:
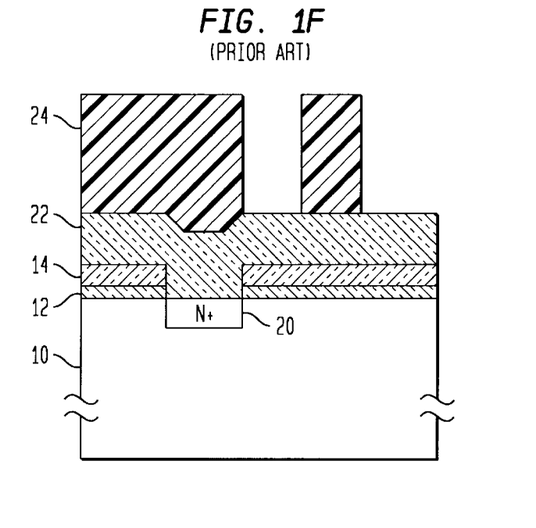

In FIG. 1F, a second photoresist mask 24 is formed on the polysilicon layer 22 to define a pattern in the polysilicon layer 22.

Figure 1G:
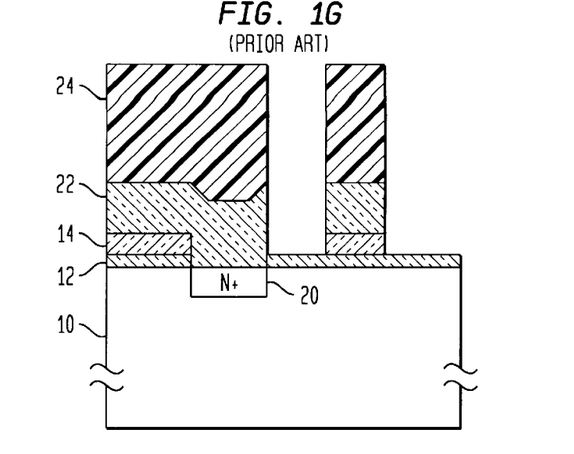

In FIG. 1G, the portions of the polysilicon layers 22, 14 exposed by the second photoresist mask 24 are anisotropically etched.

Figure 1H:
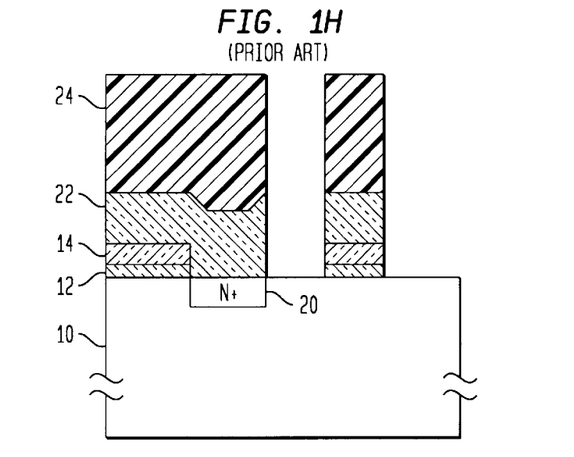

In FIG. 1H, the portions of the thin silicon oxide layer 12 that are now exposed by etching the polysilicon are anisotropically etched too.

Figure 1I:
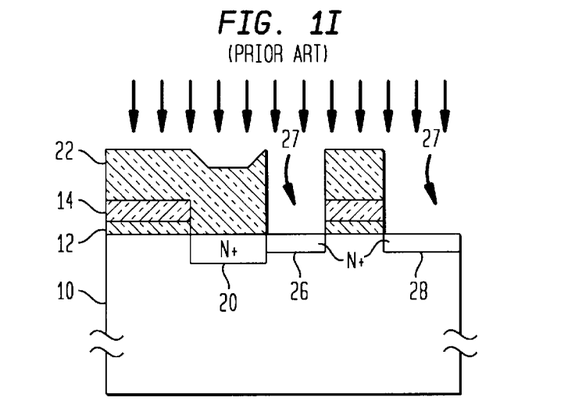

In FIG. 1I, the second photoresist mask 24 is removed and an ion implantation is performed through the openings 27 to form N+regions 26, 28 that function as source/drain.

There cannot be any discontinuity between the source/drain region 26 and the buried contact 20. Therefore, alignment of the second photoresist mask 24 is very important.

Figure 2A:
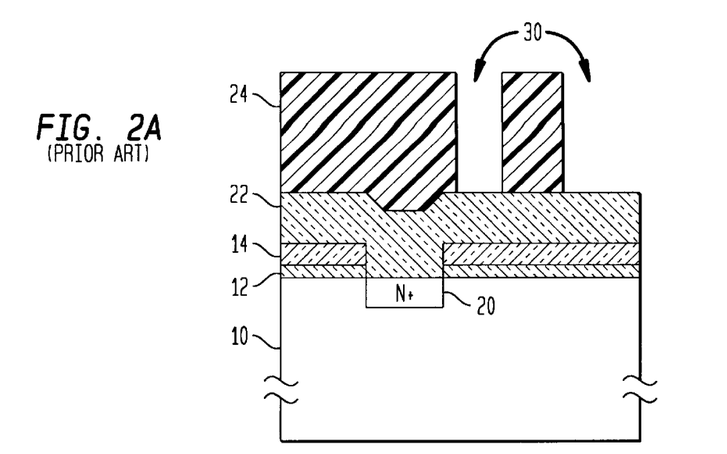
Figure 2B:
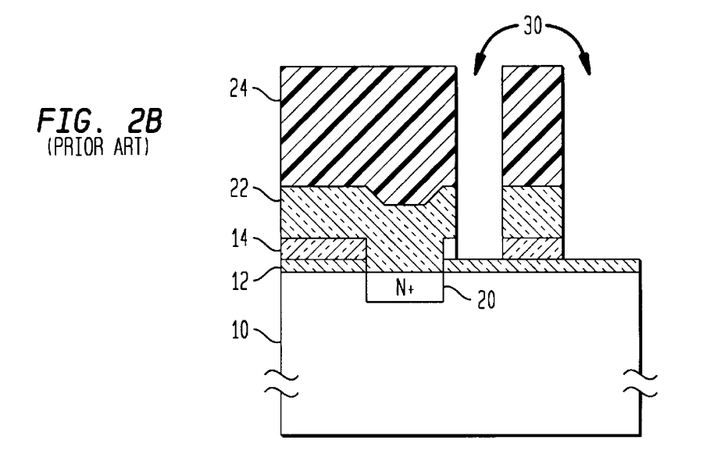
Figure 2C:
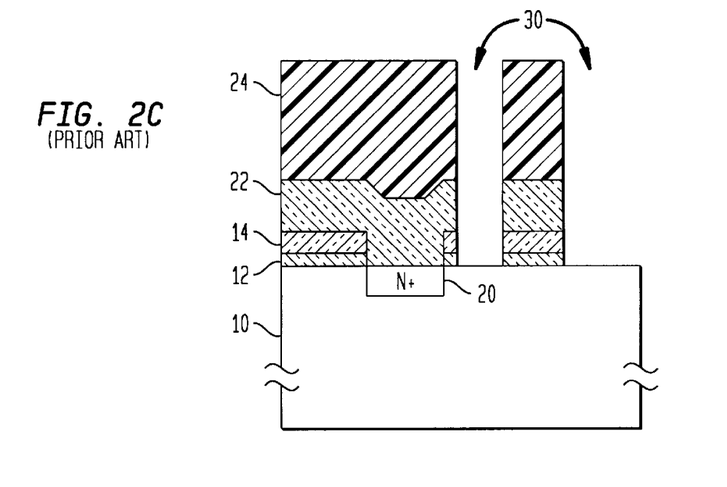
Figure 2D:
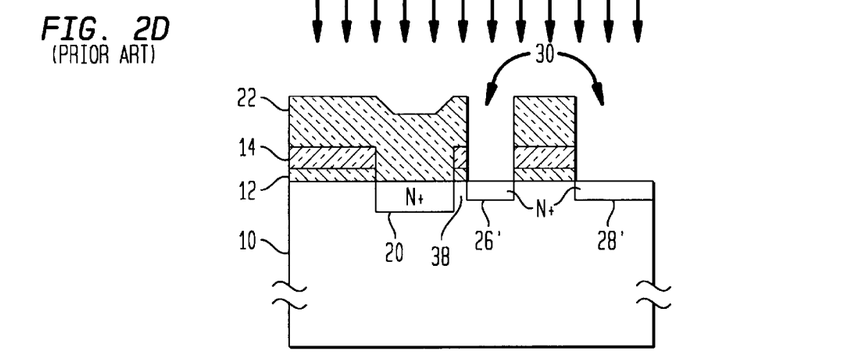

FIG. 2A shows a "right misalign" of the photoresist mask 24 during patterning of the polysilicon layers 22, 14. In particular, the mask openings 30 are too far to the right. In FIG. 2B, an anisotropic etching is performed and the exposed polysilicon etched away. In FIG. 2C, an anisotropic etching is performed and the exposed portions of the thin silicon oxide layer 12 are etched away. In FIG. 2D, the photoresist mask 24 is removed and an ion implantation is performed through the openings 30 to form source/drain N+regions 26', 28'. The buried contact N+region 20 and source/drain N+region 26' are separated by a discontinuity 38 because of the right misalign in patterning polysilicon layers 22, 14.

Figure 3A:
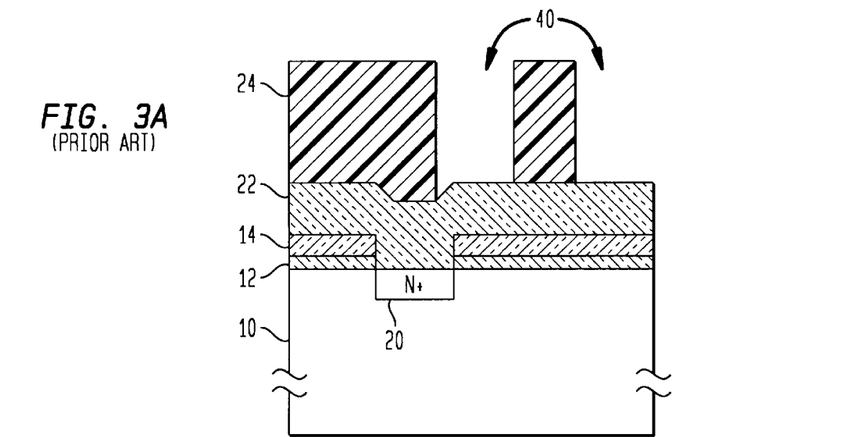
Figure 3B:
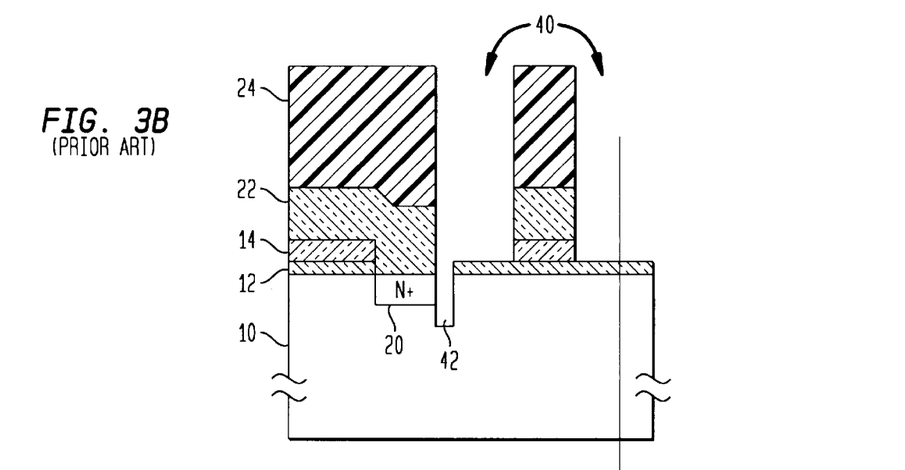
Figure 3C:
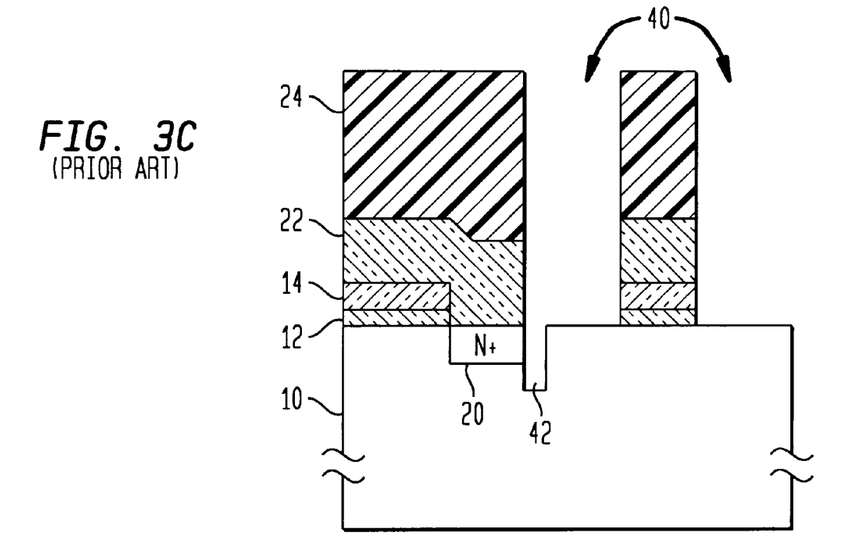
Figure 3D:
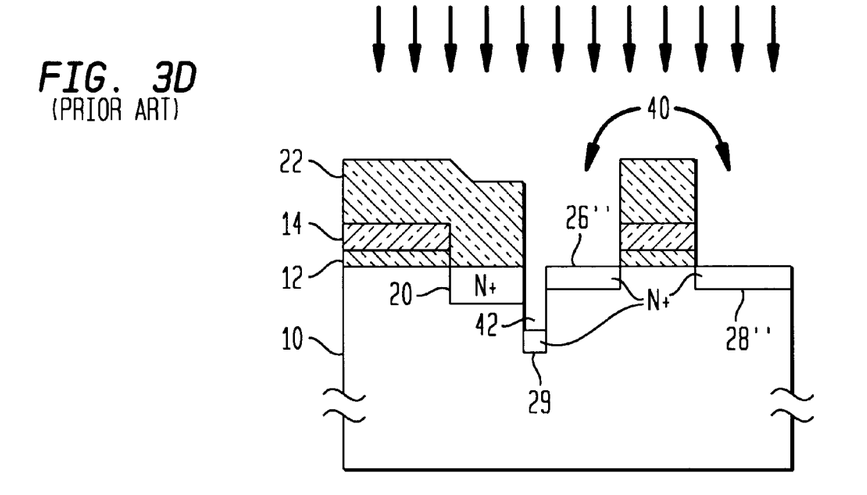

FIG. 3A shows a "left misalign" during patterning of the polysilicon layers 22, 14. In particular, mask openings 40 are too far to the left. In FIG. 3B, an anisotropic etching is performed through the openings 40 and the exposed portions of the polysilicon layers 22, 14 are etched away. Due to the similarity in etching rate of the polysilicon layers 12, 14 and the silicon substrate 10, etching damage occurs in the substrate 10. The damage arose because the opening 40 is too far to the left so that some of the substrate was exposed (i.e., not covered by the oxide 12). This damage may be deep enough to form a trench 42. In FIG. 3C, an anisotropic etching is performed through the openings 40 and exposed portions of the thin silicon oxide layer 12 are etched away. In FIG. 3D, the photoresist mask 24 is removed and an ion implantation is performed to form source/drain N+regions 26", 28". It should be noted that an N+region 29 is formed under the trench 42. This N+region 29 is not necessary for device operation. The buried contact N+region 20 and source/drain N+region 26" are isolated by the trench 42 because of the left misalign in patterning the polysilicon layers 22, 14.

The following are prior art references related to the formation of a buried contact.

Stanly Wolf, "Silicon Process for the VLSI Era", Lattice Press, Sunset Beach, Calif., 1986.

Calvin T. Gabriel, James P. McVittie, "How Plasma Etching Damages Thin Gate Oxides", Solid State Technology, June 1992, p. 81–87.

U.S. Pat. No. 5,162,259

U.S. Pat. No. 5,126,285

U.S. Pat. No. 5,326,713

U.S. Pat. No. 5,145,797

In view of the foregoing, it is an object of the present invention to provide an improved process for making a buried contact, the improved process having an increased alignment tolerance.

SUMMARY OF THE INVENTION

A method of manufacturing a buried contact is disclosed, wherein a thin silicon oxide layer is formed on the silicon substrate. The thin oxide functions as a gate dielectric. Subsequently, a thin first polysilicon layer is formed on the thin silicon oxide layer. Then, a buried contact opening is defined by a first photoresist mask. The portion of the thin polysilicon layer exposed through the first photoresist mask and the thin silicon oxide layer underneath the exposed thin polysilicon are anisotropically etched to form a buried contact hole. An ion implantation is performed into the substrate through the buried contact hole to form an N+ buried contact region. The first photoresist mask is removed and a layer of undoped silicon oxide is deposited on the entire surface. An anisotropic etching is used to etch the undoped silicon oxide. The etching depth can be controlled by this process. Residual amounts of undoped silicon oxide are retained on the vertical edges of the buried contact hole to act as spacers. A second layer of polysilicon is then deposited on the entire surface. A second photoresist mask is formed to define a pattern in the second polysilicon layer. Portions of the second polysilicon layer exposed through the second photoresist mask are etched using an anisotropic etching process. The high etching selectivity obtainable between the polysilicon layer and silicon oxide spacers avoids damage to the substrate in the case of a left misalignment. The alignment tolerance of the second photoresist mask is determined by the width of the silicon oxide spacer. A second implantation is then performed to form a source/drain N+region which is in contact with the previously formed N+region. Discontinuity of the two N+regions due to misalignment in the second masking step is avoided.

BRIEF DESCRIPTION OF THE INVENTION

FIGS. 1A through 3D illustrate a prior art method for forming a buried contact.

DETAILED DESCRIPTION OF THE INVENTION

Figure 4:
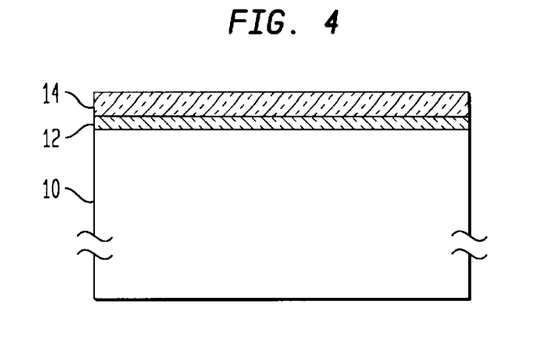
FIGS. 4 through 10, 11A through 11D, 12A through 12D and 13A through 13D illustrate the inventive method that can enlarge the alignment tolerance in a buried contact formation process.

Referring initially to FIG. 4, there is shown a silicon substrate 10. A thin silicon oxide layer 12 is first formed on the silicon substrate 10. The thin silicon oxide layer 12 can be formed either by a thermal oxidation process or by a chemical vapor deposition (CVD) process to a thickness of about 50 to 200 angstroms. The oxide layer 12 functions as gate dielectric. A thin polysilicon layer 14 is then subsequently deposited on the top of the thin silicon oxide layer. The thin polysilicon layer serves to protect the gate dielectric from contamination. It is frequently deposited by chemical vapor deposition process (CVD). The thickness of the polysilicon layer 14 is 300–1000 angstroms.

Figure 5:
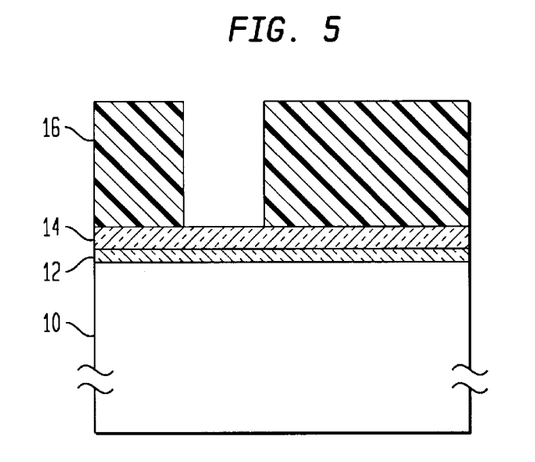

In FIG. 5, a photoresist mask 16 is formed on the thin polysilicon layer to define the buried contact pattern.

Figure 6:
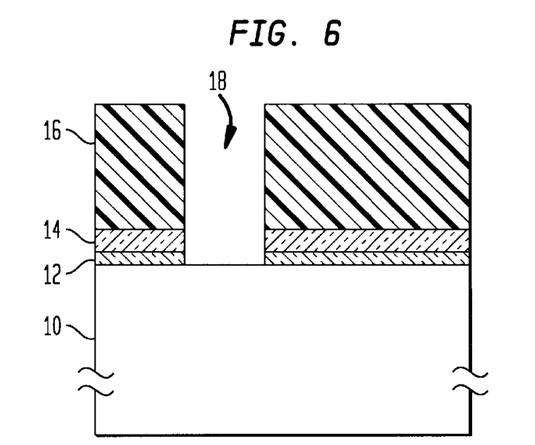

In FIG. 6, the exposed portion of the thin polysilicon layer 14 is anisotropically etched away by a plasma etching process. The etching process utilizes etching gases that have high etching selectivity between polysilicon and silicon oxide, i.e., the etching gas has a high rate for polysilicon and a low etching rate for silicon oxide. The etching gas can be $HBr/Cl_2$ or $SF_6/O_2$. Then the exposed portion of the silicon oxide layer 12 is anisotropically etched away by a plasma etching process. The etching process utilizes etching gases that have high etching selectivity between silicon substrate and silicon oxide, i.e., the etching gas has a high rate for silicon oxide and a low etching rate for silicon substrate. The etching gas can be $CCl_2$ or $CHF_3/O_2$. In this manner, the buried contact hole 18 is formed.

Figure 7:
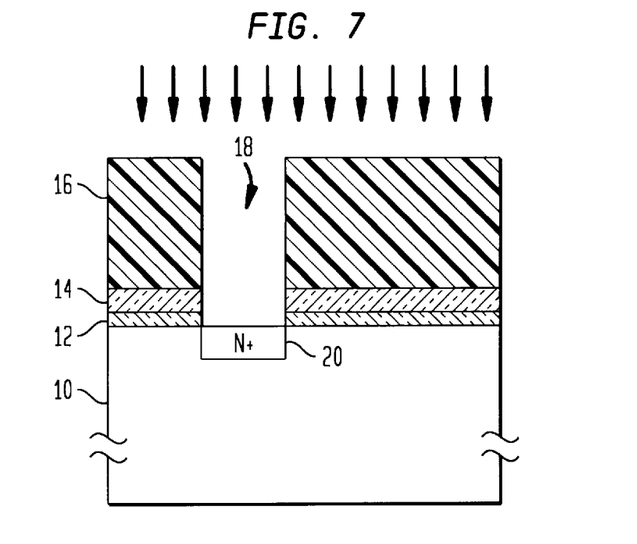

In FIG. 7, an ion implantation is performed through the buried contact hole 20 to form a buried contact N+region 20. The ion implantation process utilizes arsenic ions at an energy level of about 5 to 80 kev and a dosage level of 1E15 to 8E15/cm**2.

Figure 8:
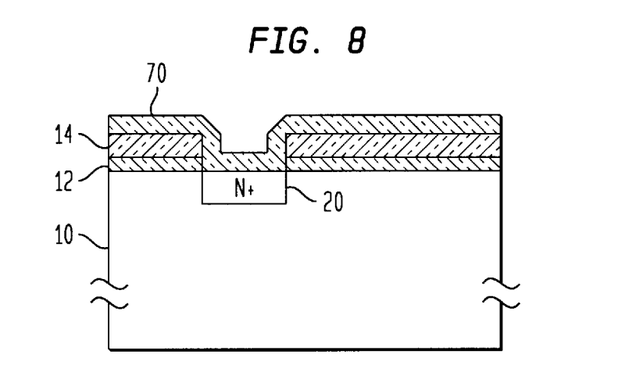

In FIG. 8, the mask 16 is removed. A layer of undoped silicon oxide is deposited on the entire surface to a thickness in the range of about 500 to 3000 angstroms by chemical vapor deposition (CVD).

Figure 9:
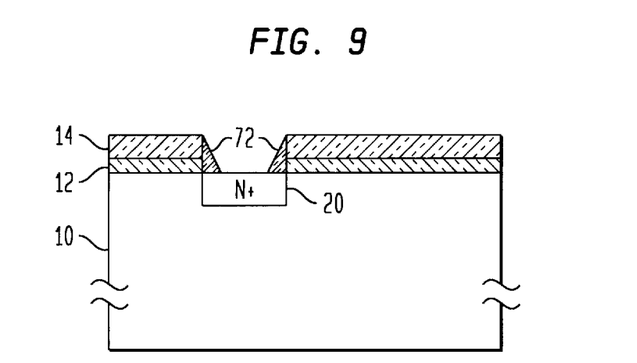

In FIG. 9, an anisotropic etching process is used to etch the undoped silicon oxide layer. In this step, the etching gas has a high etching rate for silicon oxide and a low etching rate for silicon substrate and polysilicon. The etching gas can be $CCl_2$ or $CHF_3/O_2$. Since the etching depth can be controlled by this process, residual amounts of undoped silicon oxide are retained on the vertical edges of the buried contact hole to act as spacers 72.

Figure 10:
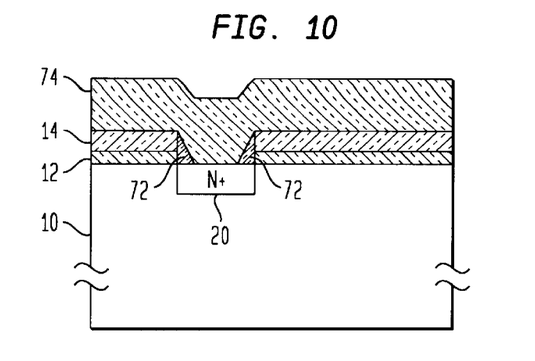

In FIG. 10, a layer of polysilicon 74 is deposited on the entire surface to a thickness in the range of about 1500 to 4500 angstroms by chemical vapor deposition (CVD). The polysilicon is heavily doped with an N-type dopant such as phosphorous to create a low electrical resistance film.

Figure 11A:
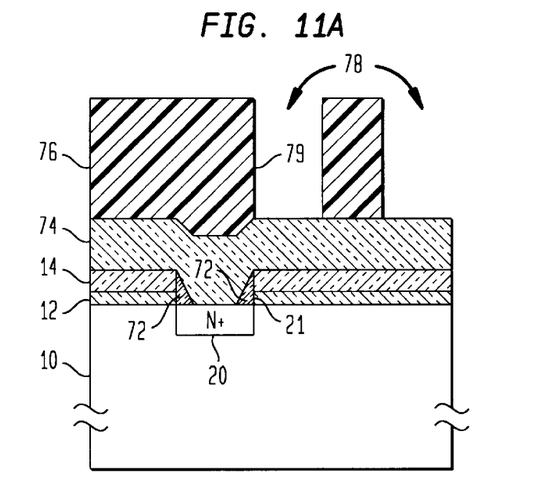

In FIG. 11A, a photoresist mask 76 is formed on the polysilicon layer 74 to define a pattern for the polysilicon layers 74, 14. In this figure, the left most edge 79 of the opening 78 in the mask 76 is aligned to the right most edge 21 of the spacer 72. This is also the right most edge of the buried contact region 20.

Figure 11B:
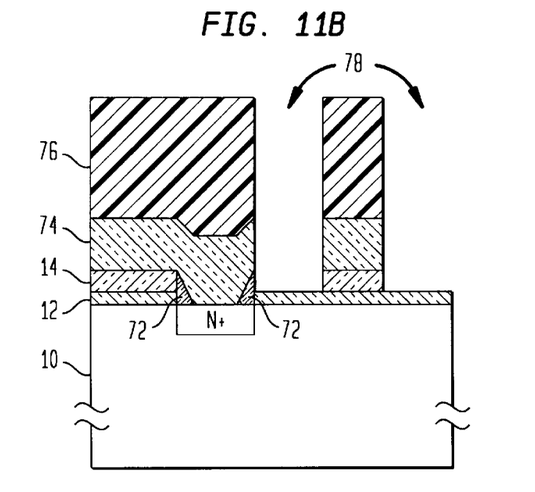

In FIG. 11B, the portion of the polysilicon layers 14, 74 exposed through the openings 78 are anisotropically etched away by a plasma etching process. The etching process utilizes etching gases that have high etching selectivity between polysilicon and silicon oxide, i.e., the etching gas has a high rate for polysilicon and a low etching rate for silicon oxide. The etching gas can be $HBr/Cl_2$ or $SF_6/O_2$.

Figure 11C:
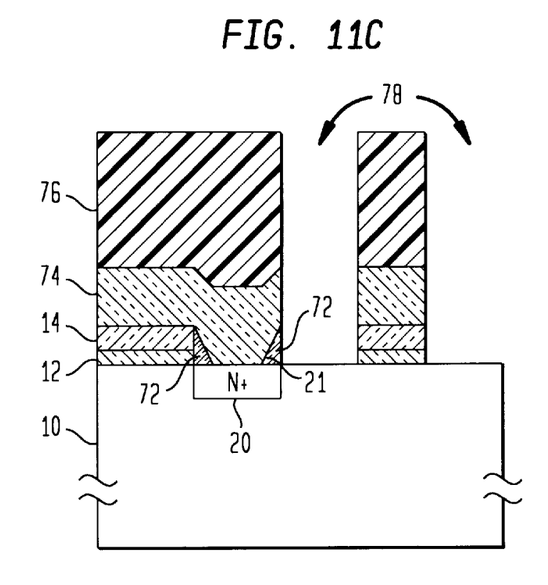

In FIG. 11C, the portion of the silicon oxide layer 12 exposed in the openings 78 is anisotropically etched away by a plasma etching process to expose the silicon substrate. The etching process utilizes etching gases that have a high etching selectivity between silicon substrate and silicon oxide, i.e., the etching gas has a high rate for silicon oxide and a low etching rate for silicon substrate. The etching gas can be $CCl_2$ or $CHF_3/O_2$.

Figure 11D:
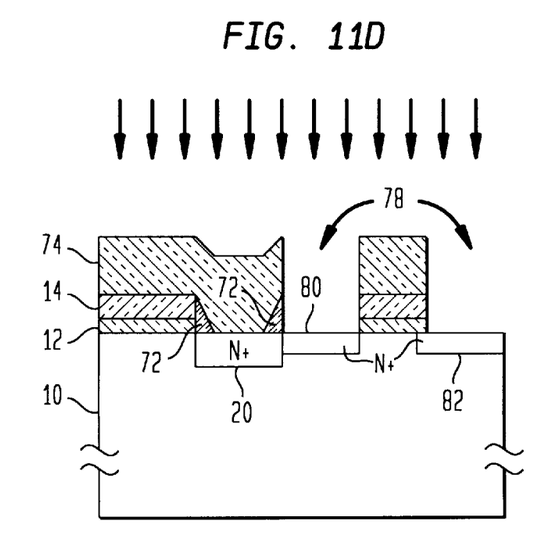

In FIG. 11D, an ion implantation is performed through the openings 78 to form source/drain N+regions 80 and 82. The ion implantation process utilizes arsenic ions at an energy level of about 5 to 80 kev and dosage level of 1E15 to 8E15/cm**2.

FIGS. 12A through 12D illustrate what happens if the openings 78 in the photoresist mask 76 are too far to the left, i.e., there is left misalignment.

Figure 12A:
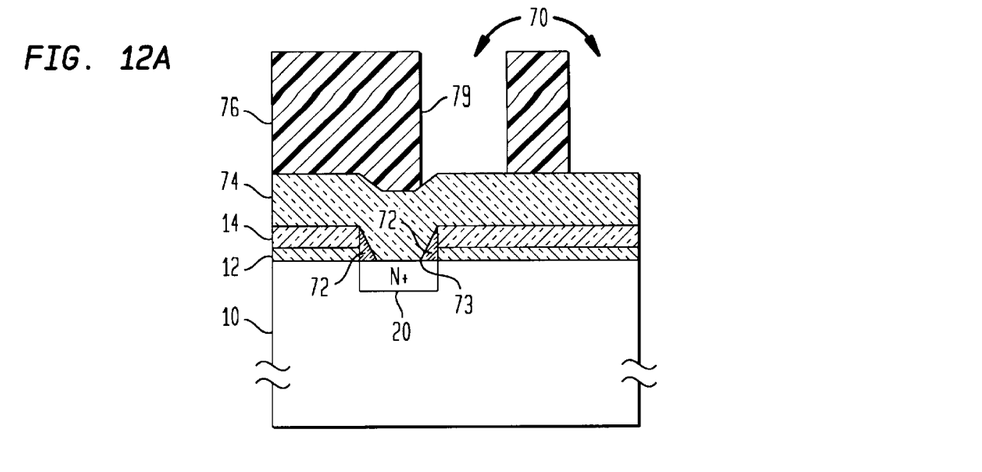

In FIG. 12A, a photoresist mask 76 is formed on the polysilicon layer 74 to define the pattern for the polysilicon layers 14, 74. In this figure, the left most edge 79 of the left most opening 78 is aligned to the left spacer edge 73.

Figure 12B:
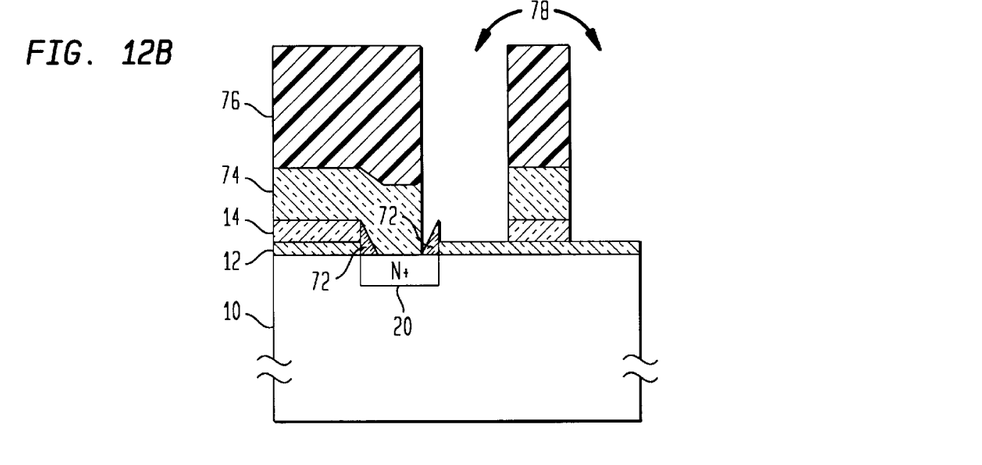

In FIG. 12B, the exposed polysilicon layers 14, 74 are anisotropically etched away through the opening 78 by a plasma etching process. The etching process utilizes etching gases that have high etching selectivity between polysilicon and silicon oxide. The etching gas can be $HBr/Cl_2$ or $SF_6/O_2$.

Figure 12C:
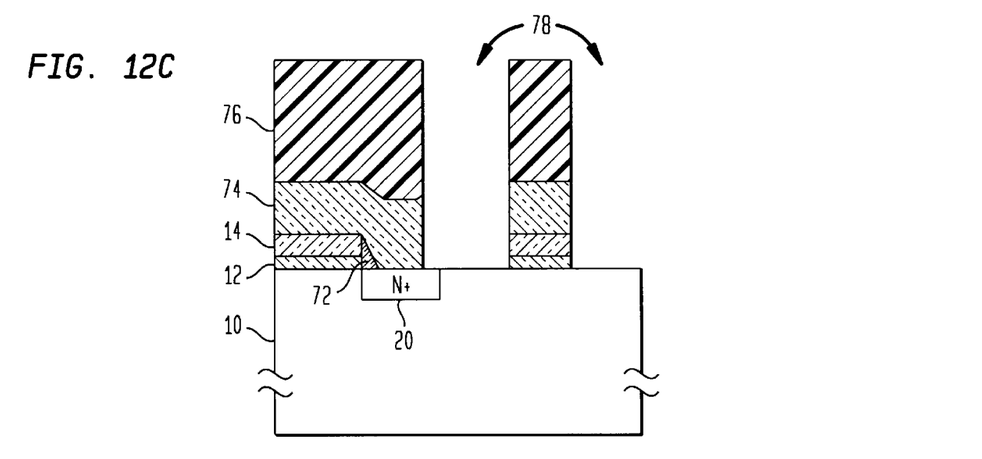

In FIG. 12C, then the portions of the silicon oxide layer 12 now exposed through the openings 78 are anisotropically etched away by a plasma etching process. The etching process utilizes etching gases that have high etching selectivity between silicon substrate and silicon oxide, i.e., the etching gas has a high rate for silicon oxide and a low etching rate for silicon substrate. The etching gas can be $CCl_2$ or $CHF_3/O_2$. The silicon substrate 10 is now exposed through the openings 78. Note that the right most silicon oxide spacer 72 has been etched away.

Figure 12D:
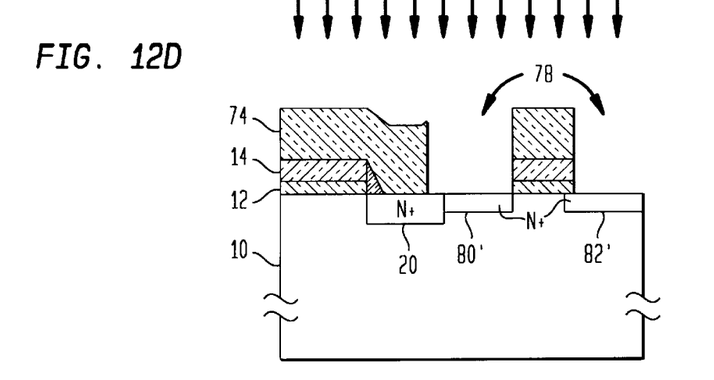

In FIG. 12D, an ion implantation is performed through the openings 78 to form source/drain N+regions 80', 82'. The ion implantation process utilizes arsenic ions at an energy level of about 5 to 80 kev and dosage level of 1E15 to 8E15cm**2. Note that in contrast to the left misalignment case in the prior art (see FIGS. 3A–3D) no trench between the buried contact 20 and the source/drain region 80' is formed. Instead, the buried contact 20 and the source/drain region 80' are continuous. There is no discontinuity as in the prior art.

The advantage of the invention is significant. In this invention, spacers are formed on the sidewalls of the buried contact hole. In the process of patterning the polysilicon layers 14, 74 using a mask aligned to the rightmost or leftmost edge of the rightmost spacer 72, a discontinuity between a buried contact N+region and a source/drain N+region is avoided.

According to the invention, the alignment tolerance for the second photoresist mask is determined by the spacer width. That is, the pattern for forming the source/drain region can be aligned with the right most spacer edge or the left most edge or anyplace in between. Thus, the alignment tolerance is the width of the spacer 72.

Figure 13A:
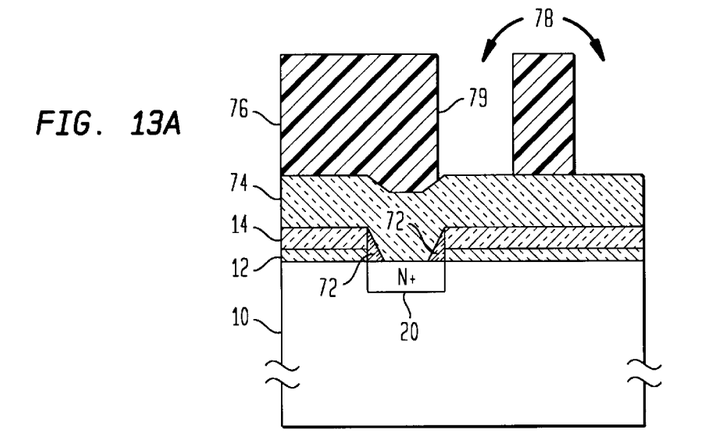
Figure 13B:
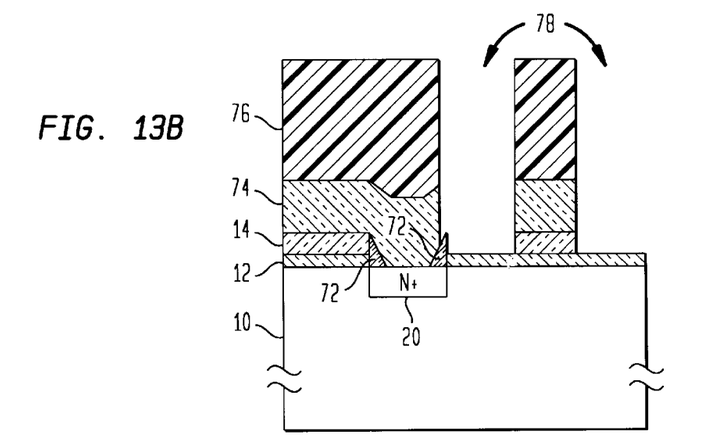
Figure 13C:
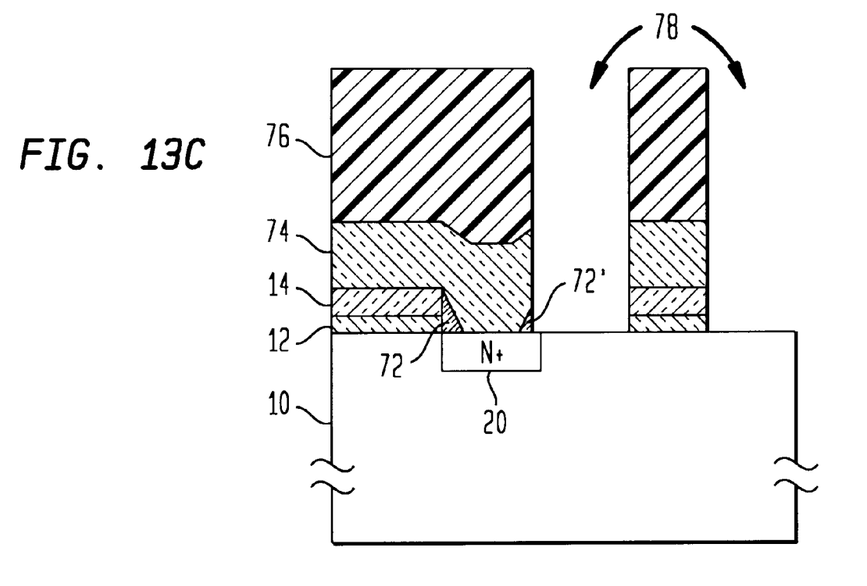
Figure 13D:
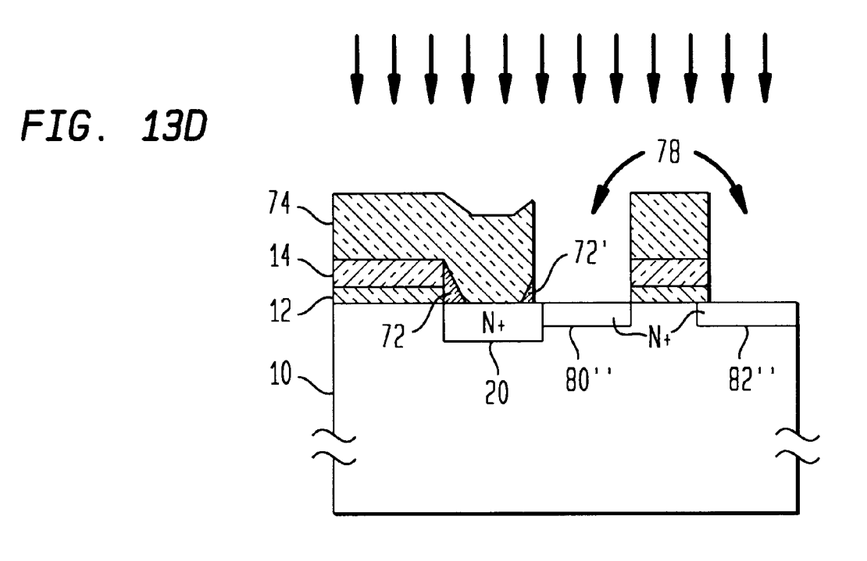

As shown in FIGS. 13A through 13D, the left edge of the leftmost mask opening 78 is aligned with the center of the rightmost spacer 72. In FIG. 13B, the portions of the polysilicon layers 14, 74 exposed through the openings 78 are removed so that a portion of the rightmost spacer 72 extends into the openings 78. In FIG. 13C, the exposed portions of the right most oxide spacer 72 and the exposed portion of the oxide layer 12 are removed. In FIG. 13D, the N+type source/drain regions 80", 82" are formed by ion implantation.

In a preferred embodiment, the substrate is P-type. In an alternative embodiment, an N-type substrate with a P-well is used. In this case, the buried contact and source drain regions are formed in the P-well.

Finally, the above described embodiments of the invention are intended to be illustrative only. Numerous alternative embodiments may be devised by those skilled in the art without departing from the spirit and scope of the following claims.

I claim:

1. A method for forming a buried contact comprising the steps of (a) forming a gate dielectric layer on a silicon substrate (b) forming a first polysilicon layer on said gate dielectric layer, (c) performing a first patterning on said gate dielectric layer and said first polysilicon layer to form a buried contact hole, (d) ion implanting a buried contact region in said substrate through said buried contact hole, (e) forming a dielectric spacer on a sidewall of said buried contact hole, (f) depositing a second layer of polysilicon on said remaining portion of said first polysilicon layer, on said spacer, and in said buried contact hole, (g) performing a second patterning on said second polysilicon layer and said gate dielectric layer to form an opening having an edge whose alignment is between a rightmost edge and a leftmost edge of said spacer, including the step of etching said second polysilicon layer, said gate dielectric and said spacer through said opening, to ensure continuity between said buried contact and an adjacent source/drain region and to inhibit the reduction of the size of the opening of said buried contact, and (h) implanting a source/drain region in said substrate which is continuous with said buried contact region.

2. The method of claim 1 wherein said gate dielectric is silicon oxide.

3. The method of claim 1 wherein said spacer is formed by depositing a layer of silicon oxide and anisotropically etching the silicon oxide.

4. The method of claim 1 wherein said first patterning step utilizes a first photoresist mask.

5. The method of claim 4 wherein said second patterning step utilizes a second photoresist mask.

* * * * *